United States Patent
Jang et al.

(10) Patent No.: US 6,839,274 B2
(45) Date of Patent: Jan. 4, 2005

(54) MAGNETIC RANDOM ACCESS MEMORY

(75) Inventors: In Woo Jang, Seoul (KR); Young Jin Park, Kyoungki-do (KR); Kye Nam Lee, Kyoungki-do (KR); Chang Shuk Kim, Kyoungki-do (KR); Hee Kyung, Kyoungki-do (KR)

(73) Assignee: Hynix Semiconductor Inc., Gyunggi-do (KR)

( * ) Notice: Subject to any disclaimer, the term of this patent is extended or adjusted under 35 U.S.C. 154(b) by 19 days.

(21) Appl. No.: 10/335,437

(22) Filed: Dec. 30, 2002

(65) Prior Publication Data

US 2003/0214839 A1 Nov. 20, 2003

(30) Foreign Application Priority Data

May 20, 2002 (KR) ................................ 10-2002-0027907

(51) Int. Cl.[7] ................................................. G11C 11/15
(52) U.S. Cl. ..................... 365/173; 365/158; 365/171; 365/209; 257/295; 257/296
(58) Field of Search .................. 365/173, 158, 365/171, 209; 257/295, 296

(56) References Cited

U.S. PATENT DOCUMENTS

| | | | |
|---|---|---|---|
| 6,097,625 A | 8/2000 | Scheuerlein | |
| 6,269,018 B1 | 7/2001 | Monsma et al. | |
| 2001/0035545 A1 | 11/2001 | Schuster-Woldan et al. | |
| 2002/0041515 A1 | 4/2002 | Ikeda et al. | |
| 2002/0093849 A1 * | 7/2002 | Hidaka | 365/158 |
| 2003/0076708 A1 * | 4/2003 | Hidaka | 365/171 |

FOREIGN PATENT DOCUMENTS

| | | |
|---|---|---|
| DE | 199 14 488 C1 | 5/2000 |
| DE | 199 14 489 C1 | 6/2000 |
| DE | 100 10 457 A1 | 9/2001 |
| DE | 101 13 853 A1 | 10/2001 |
| JP | 2001-217398 | 8/2001 |
| JP | 2002-008366 | 1/2002 |

OTHER PUBLICATIONS

Summary of foreign patent application No. DE 199 14 488 C1.
Summary of foreign patent application No. DE 19914 489 C1.
Summary of foreign patent application No. DE 101 13 853 A1.
Summary of foreign patent application No. DE 101 10 457 A1.
Search Report from German Patent Office dated Dec. 19, 2003.
Notice of Rejection –Korean Intellectual Property Office; Transmittal No. Sep. 5, 2004–012397563; Transmittal Date: Mar. 30, 2004 (4 pages).

* cited by examiner

Primary Examiner—Van Thu Nguyen
Assistant Examiner—Nam Nguyen
(74) Attorney, Agent, or Firm—Marshall, Gerstein & Borun LLP

(57) ABSTRACT

A magnetic random access memory (MRAM) using a common line is described herein. An MTJ element is positioned on the common line of the MRAM. The common line connected to a source of a transistor transmits a ground level voltage for reading data and supplies a current for writing data.

4 Claims, 3 Drawing Sheets

US 6,839,274 B2

MAGNETIC RANDOM ACCESS MEMORY

TECHNICAL FIELD

The present disclosure relates generally to semiconductor memory, and more particularly, to a magnetic random access memory (MRAM).

BACKGROUND

Most of the semiconductor memory manufacturing companies have developed the MRAM using a ferromagnetic material as one of the next generation memory devices. The MRAM is a memory device to store information by forming multi-layer ferromagnetic thin films. The stored information can be read by sensing current variations according to a magnetization direction of the respective thin film. The MRAM operates at a high speed, reduces power consumption, allows high integration density by the special properties of the magnetic thin film, and performs a non-volatile memory operation such as a flash memory.

The MRAM embodies memory devices by using the fact that the spin influences electron transmission. First, the MRAM using a giant magneto resistive (GMR) phenomenon utilizes the fact that resistance is larger when spin directions are different in two magnetic layers having a non-magnetic layer therebetween than when spin directions are identical. Second, the MRAM using a spin-polarized magneto-transmission (SPMT) phenomenon utilizes the fact that larger current transmission is generated when spin directions are identical in two magnetic layers having an insulating layer therebetween than when spin directions are different. However, the MRAM research is still in its early stage and mostly concentrated on the formation of multi-layer magnetic thin films, i.e., less on the researches on a unit cell structure and a peripheral sensing circuit.

FIG. 1 is a cross-sectional diagram illustrating a conventional MRAM. Referring to FIG. 1, a source region and a drain region are defined by two N+ regions 13 separately formed on a P-substrate 11. A source contact 17 is formed on the N+ region 13 corresponding to the source region, and a drain contact 19 is formed on the N+ region 13 corresponding to the drain region. The source contact 17 and the drain contact 19 are formed in the same layer as a first interlayer insulating film 21. A gate electrode 15 is separately formed between the source contact 17 and the drain contact 19, and a gate oxide film 14 is formed below the gate electrode 15.

A first contact plug 25 and a second contact plug 27 are formed on the source contact 17 and the drain contact 19, respectively. A ground line 29 and a metal line 33 are formed on the first contact plug 25 and the second contact plug 27, respectively. Accordingly, the ground line 29 and the source contact 17 are electrically connected by the first contact plug 25, and the metal line 33 and the drain contact 19 are electrically connected by the second contact plug 27. A write line 31 is separately formed between the ground line 29 and the metal line 33. The ground line 29, the metal line 33, and the write line 31 are formed in the same layer as a third interlayer insulating film 35.

A third contact plug 39 is formed on the metal line 33 in the same layer as a fourth interlayer insulating film 37. A connection film 41 is formed on the third contact plug 39 to overlap with the write line region. Here, the connection film 41 is formed in the same layer as a fifth interlayer insulating film 43.

An MTJ element 51 is formed on the connection film 41 and in the same layer as a sixth interlayer insulating film 53. The MTJ element 51 has a stacked structure of a pinned ferromagnetic layer 45, a tunnel barrier layer 47, and a free ferromagnetic layer 49. A bit line 55 is formed on the MTJ element 51.

As described above, the conventional MRAM cell is composed of one field effect transistor and one MTJ element. When a voltage is applied to the gate electrode 15 (i.e., word line), the transistor is turned on. As a result, the MRAM cell reads data stored in the MTJ element 51 by sensing the amount of current flowing through the bit line 55. Here, the MTJ element 51 controls the current according to a magnetization direction of the free ferromagnetic layer 49.

In addition, the data can be written by controlling the magnetization direction of the MTJ element 51 in the opposite way. That is, the field effect transistor is turned off, and a current is supplied to the write line 31 and the bit line 55. A magnetic field is generated in response to the current flowing through the write line 31 and the bit line 55 configured to influence the free ferromagnetic layer 49. As a result, the magnetization direction of the MTJ element 51 is controlled. Here, the current is supplied to the bit line 55 and the write line 31 at the same time so that the MTJ cell can be selected from a vertical intersecting portion of two metal lines.

The conventional MRAM must include the write line 31 to write the data on the MTJ element 51. Also, the write line 31 must have at least minimum isolated space from the ground line 29 and the metal line 33, which are formed in the same layer (i.e., the third interlayer insulating film 35). Accordingly, there is a problem in the conventional MRAM as the size of the MRAM cell increases. Further, there is a need for a process to form the write line because of the aforementioned structural problem, which complicates the process for manufacturing the MRAM.

SUMMARY OF THE DISCLOSURE

A magnetic random access memory (MRAM) configured to achieve high integration and to simplify the whole process by using a ground line connected to a source terminal as a write line instead of forming a special write line is described herein. The MRAM includes: a substrate including a source region, a drain region and a gate region; a word line formed on the gate region; a source contact formed on the source region; a drain contact formed on the drain region; a common line electrically connected to the upper portion of the source contact by a first contact plug; a metal line electrically connected to the upper portion of the drain contact by a second contact plug; a connection film electrically connected to the upper portion of the metal line by a third contact plug to overlap the upper portion of the common line; an MTJ element formed on the connection film and positioned on the common line region; and a bit line connected to the MTJ element. A ground level voltage in a data read operation is applied to the common line, and an amount of current in a data write operation is supplied for the common line.

Alternatively, the MRAM includes: an MRAM cell including one transistor and one MTJ element connected to a drain of the transistor; a bit line connected to the MTJ element; a word line connected to a gate of the transistor; a common line connected to a source of the transistor; first and second transistors connected to both ends of the common line for switching a ground level voltage; third and fourth transistors connected in parallel to the first and second transistors at both ends of the common line; and a current forcing circuit connected individually to the third and fourth transistors to supply a current. The first and second transistors in a data read operation are turned on to apply the ground level voltage to the common line, and the third and fourth transistors in a data write operation are turned on to supply the current of the current forcing circuit for the common line.

BRIEF DESCRIPTION OF THE DRAWINGS

The disclosure will be described in terms of several embodiments to illustrate its broad teachings. Reference is also made to the attached drawings.

DETAILED DESCRIPTION

Figure 1:
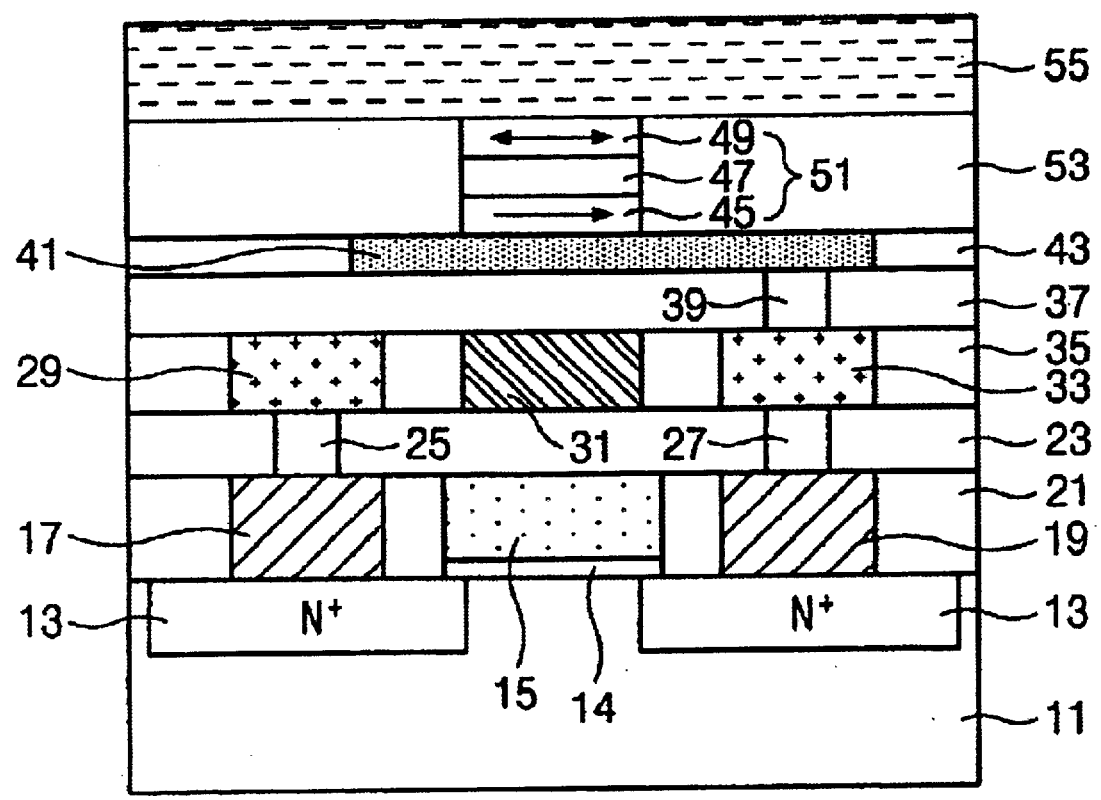
FIG. 1 is a cross-sectional diagram illustrating a conventional MRAM.
Figure 2:
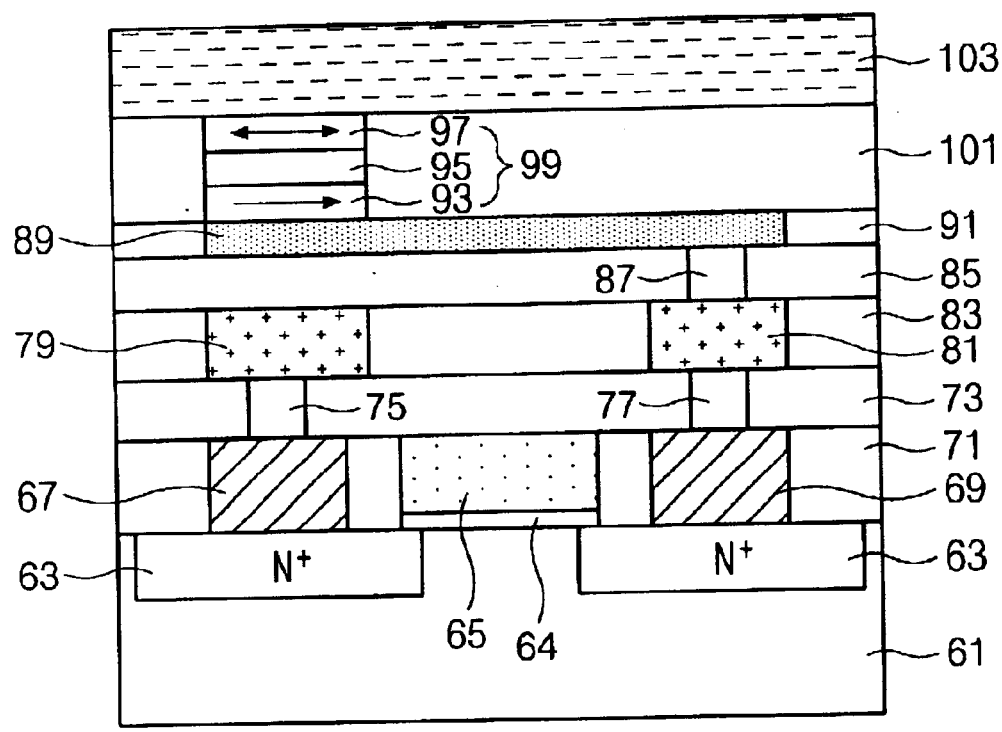
FIG. 2 is a cross-sectional diagram illustrating an MRAM.

The present disclosure will be described in detail with reference to the accompanying drawings. A structure of the MRAM to write data on an MTJ element by using a common line and a bit line is described herein. Referring to FIG. 2, a source region and a drain region are defined by two N+ regions 63 separately formed on a P-substrate 61. A source contact 67 is formed on the N+ region 63 corresponding to the source region, and a drain contact 69 is formed on the N+ region 63 corresponding to the drain region. The source contact 67 and the drain contact 69 are formed in the same layer as a first interlayer insulating film 71. A gate electrode 65 is separately formed between the source contact 67 and the drain contact 69. A gate oxide film 64 is formed below the gate electrode 65.

A first contact plug 75 and a second contact plug 77 are formed on the source contact 67 and the drain contact 69, respectively. A common line 79 and a metal line 81 are formed on the first contact plug 75 and the second contact plug 77, respectively. Accordingly, the common line 79 and the source contact 67 are electrically connected by the first contact plug 75, and the metal line 81 and the drain contact 69 are electrically connected by the second contact plug 77. Here, the common line 79 is composed of a high conductive metal such as copper (Cu) and aluminum (Al) at a thickness of 4000 to 5000 Å. The common line 79 and the metal line 81 are formed in the same layer as a third interlayer insulating film 83.

A third contact plug 87 is formed on the metal line 81 in the same layer as a fourth interlayer insulating film 85. A connection film 89 is formed on the third contact plug 87 to overlap with the common line region. Here, the connection film 89 is formed in the same layer as a fifth interlayer insulating film 91.

An MTJ element 99 is formed on the connection film 89 and in the same layer as a sixth interlayer insulating film 101. The MTJ element 99 has a stacked structure of a pinned ferromagnetic layer 93, a tunnel barrier layer 95, and a free ferromagnetic layer 97. A bit line 103 is formed on the MTJ element 99.

In the MTJ element 99, the pinned ferromagnetic layer 93 has a fixed magnetization direction, and the free ferromagnetic layer 97 has its magnetization direction varied by an electric field. The MTJ element 99 memorizes information of 0 or 1 according to the magnetization direction. Here, the MTJ element 99 is positioned to overlap with the upper portion of the common line 79.

Figure 3:
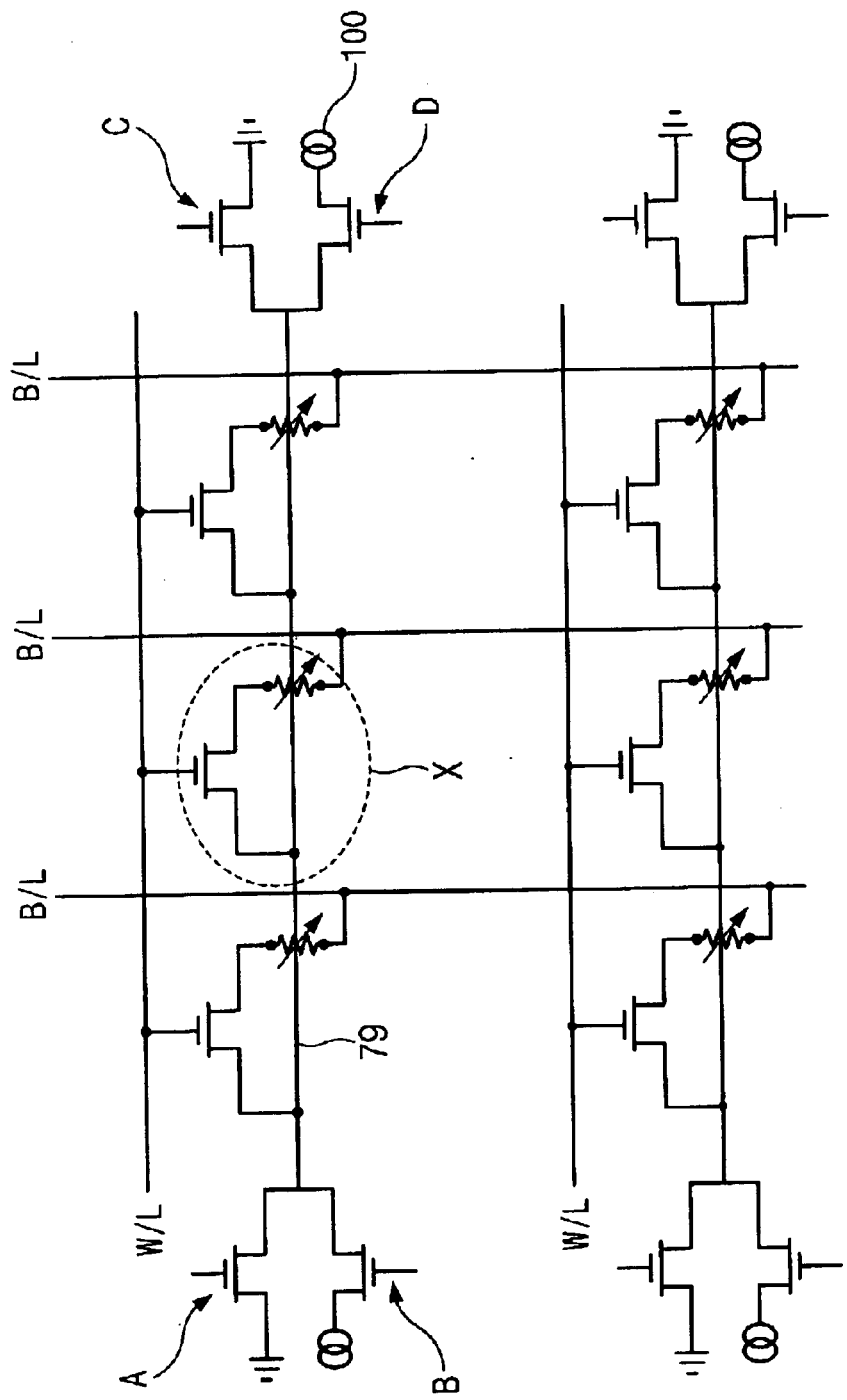
FIG. 3 is a circuit diagram illustrating an operation of the MRAM.

FIG. 3 is a circuit diagram illustrating an operation of the MRAM. A bit line 55 and a word line 65 (gate line) intersect each other, and one cell X includes one transistor and one MTJ element. The common line 79 is connected to a source of the transistor and passes the lower portion of the MTJ element. Transistors A, B, C and D are connected to both ends of the common line 79. Here, the transistors A and B are connected in parallel to one end of the common line 79, and the transistors C and D are connected in parallel to the other end of the common line 79. The transistors A and C have a bias voltage of ground level, and the transistors B and D are connected to a current forcing circuit 100.

The MTJ element is a resistance variation element. Exemplary resistance variation elements include all kinds of magneto resistive elements whose resistance values are varied by magnetization or magnetism such as MTJ cell, AMR, GMR, spin valve, ferromagnetic substance/ metal-semiconductor hybrid structure, group III–V magnetic semiconductor composite structure, metal (semi-metal)/ semiconductor composite structure and clossal magnetoresistance (CMR), and phase transformation elements whose resistance values are varied by material phase transformation by an electric signal.

In the read operation, the cell X is selected by the word line W/L and the bit line B/L. A gate voltage is applied to the word line W/L, and a current flowing through the bit line is sensed. Here, the ground voltage must be biased in a source of the cell X. Accordingly, the transistors B and D connected to the current forcing circuit 100 are turned off, and the transistors A and C having the bias voltage of ground level are turned on. That is, the amount of current influenced by resistance variations of the MTJ element is sensed when the current flows to the cell X and the bit line B/L through the turned-on transistors A and C.

In the write operation, the cell X is selected by using the word line W/L and the bit line B/L. The current is supplied to the ground line 79, and the MTJ element of the cell X is magnetized in a specific direction according to the current supplied to the bit line B/L to write the data. In particular, the transistors A and C connected to both ends of the common line 79 are turned off, and the transistors B and D are turned on. Accordingly, the current supplied from the current forcing circuit 100 is transmitted to the common line 79. Thus, the data are written on the cell X according to the current supplied to the bit line B/L.

The common line of the MRAM is used to write the data so that a margin of the MRAM cell may be obtained and the size of the cell may be reduced. As a result, the MRAM can be highly integrated. In addition, the structural improvements of the MRAM simplify the process for manufacturing the MRAM.

Although the MRAM described herein is particularly well suited for use with a magnetic field detecting device such as a magnetic hard disk head and a magnetic sensor, persons of ordinary skill in the art will readily appreciate that the teachings of this disclosure can be employed in other devices.

Many changes and modifications to the embodiments described herein could be made. The scope of some changes is discussed above. The scope of others will become apparent from the appended claims.

What is claimed is:

1. A magnetic random access memory (MRAM) comprising:

a substrate including a source region, a drain region and a gate region;

a word line formed on the gate region;

a source contact formed on the source region;

a drain contact formed on the drain region;

a common line electrically connected to the upper portion of the source contact by a first contact plug;

a metal line electrically connected to the upper portion of the drain contact by a second contact plug;

a connection film electrically connected to the upper portion of the metal line by a third contact plug, the connection film configured to overlap the upper portion of the common line;

an MTJ element formed on the connection film and positioned on the common line region; and a bit line connected to the MTJ element, wherein a ground level voltage in a data read operation is applied to the common line, and an amount of current in a data write operation is supplied for the common line.

2. The MRAM according to claim 1, wherein the common line is composed of aluminum or copper.

3. The MRAM according to claim 1, wherein the common line has a thickness of 4000 to 5000 Å.

4. A magnetic random access memory (MRAM) comprising:

an MRAM cell including one transistor and one MTJ element connected to a drain of the transistor;

a bit line connected to the MTJ element;

a word line connected to a gate of the transistor;

a common line connected to a source of the transistor;

first and second transistors connected to both ends of the common line for switching a ground level voltage;

third and fourth transistors connected in parallel to the first and second transistors at both ends of the common line; and a current forcing circuit connected individually to the third and fourth transistors, the current forcing circuit configured to supply a current;

wherein the first and second transistors are turned on to apply the ground level voltage to the common line in a data read operation, and the third and fourth transistors are turned on to supply the current of the current forcing circuit for the common line in a data write operation.

\* \* \* \* \*